United States Patent
Ernst et al.

(10) Patent No.: US 7,910,917 B2
(45) Date of Patent: Mar. 22, 2011

(54) STRUCTURE AND METHOD FOR REALIZING A MICROELECTRONIC DEVICE PROVIDED WITH A NUMBER OF QUANTUM WIRES CAPABLE OF FORMING ONE OR MORE TRANSISTOR CHANNELS

(75) Inventors: Thomas Ernst, Morette (FR); Stephan Borel, Saint Martin d'Heres (FR)

(73) Assignee: Commissariat a l'Energie Atomique, Paris (FR)

(*) Notice: Subject to any disclaimer, the term of this patent is extended or adjusted under 35 U.S.C. 154(b) by 766 days.

(21) Appl. No.: 11/910,802

(22) PCT Filed: Apr. 10, 2006

(86) PCT No.: PCT/FR2006/050322
§ 371 (c)(1),
(2), (4) Date: Oct. 5, 2007

(87) PCT Pub. No.: WO2006/108987
PCT Pub. Date: Oct. 19, 2006

(65) Prior Publication Data
US 2008/0149919 A1    Jun. 26, 2008

(30) Foreign Application Priority Data
Apr. 13, 2005 (FR) ....................... 05 50947

(51) Int. Cl.
H01L 29/12 (2006.01)
H01L 21/336 (2006.01)

(52) U.S. Cl. .............. 257/24; 257/347; 257/E29.07; 257/21.403

(58) Field of Classification Search .............. 257/24, 257/347
See application file for complete search history.

(56) References Cited

U.S. PATENT DOCUMENTS

| | | | |
|---|---|---|---|
| 5,965,914 A | | 10/1999 | Miyamoto |
| 6,121,157 A | * | 9/2000 | Nakajima ................. 438/737 |
| 6,127,702 A | | 10/2000 | Yamazaki et al. |
| 6,632,696 B2 | * | 10/2003 | Kimura et al. ............... 438/30 |
| 6,727,186 B1 | | 4/2004 | Skotnicki et al. |
| 6,903,460 B2 | * | 6/2005 | Fukuda et al. ............... 257/758 |
| 2004/0051150 A1 | | 3/2004 | Wu |
| 2004/0063286 A1 | | 4/2004 | Kim et al. |

(Continued)

OTHER PUBLICATIONS

Yung-Chun Wu, et al. "High-performance polycrystalline silicon thin-film transistor with multiple nanowire channels and lightly doped drain structure" Applied Physics Letters, vol. 84, No. 19, May 10, 2004, American Institute of Physics, XP001220931, pp. 3822-3824.

(Continued)

*Primary Examiner* — Alexander G Ghyka
(74) *Attorney, Agent, or Firm* — Oblon, Spivak, McClelland, Maier & Neustadt, L.L.P.

(57) ABSTRACT

A microelectronic device provided with one or more quantum wires, able to form one or more transistor channels, and optimized in terms of arrangement, shape, and/or composition. A method for fabricating the device includes forming, in one or more thin layers resting on a support, a first block and a second block in which at least one transistor drain region and at least one transistor source region are respectively intended to be formed, forming a structure connecting the first block to the second block, and forming, on the surface of the structure, wires connecting a first region of the first block with another region of the second block that faces the first region.

8 Claims, 11 Drawing Sheets

U.S. PATENT DOCUMENTS

| | | |
|---|---|---|
| 2004/0166642 A1 | 8/2004 | Chen et al. |
| 2004/0227187 A1 | 11/2004 | Cheng et al. |
| 2006/0258132 A1* | 11/2006 | Brown et al. .............. 438/610 |
| 2007/0126035 A1 | 6/2007 | Ernst et al. |

OTHER PUBLICATIONS

J. L. Liu, et al. "A method for fabricating silicon quantum wires based on SiGe/Si heterostructure" Applied Physics Letters, vol. 68, No. 3, Jan. 15, 1996, American Institute of Physics, XP 000552744, pp. 352-354.

H. Okada, et al. "A Novel Wire Transistor Structure with In-Plane Gate Using Direct Schottky Contacts to 2DEG" Extended Abstracts of the 1994 International Conference on Solid State Devices and Materials, XP 000543982, pp. 971-972.

Sung-Young Lee, et al, "A Novel Multibridge-Channel MOSFET (MBCFET): Fabrication Technologies and Characteristics", IEEE Transactions on Nanotechnology, vol. 2, No. 4, Dec. 2003, pp. 253-257.

U.S. Appl. No. 12/740,907, filed Apr. 30, 2010, Thomas et al.

* cited by examiner

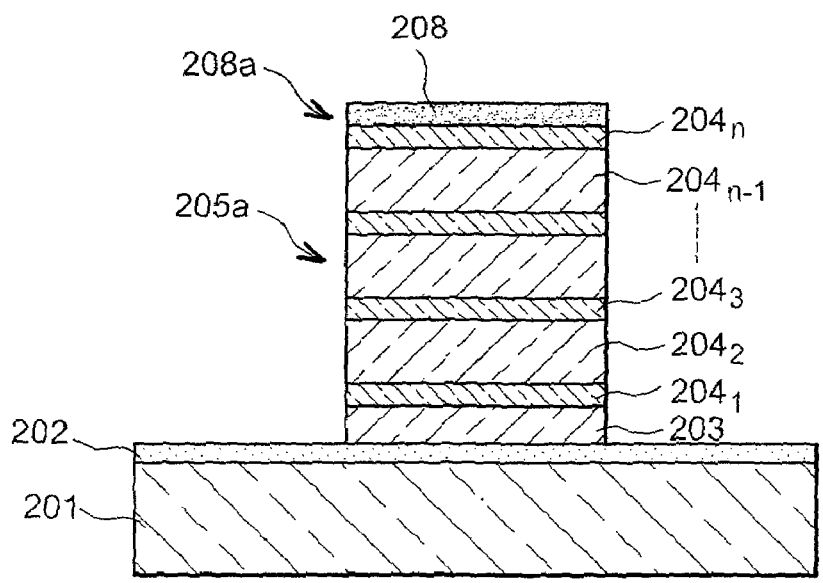
FIG. 3C
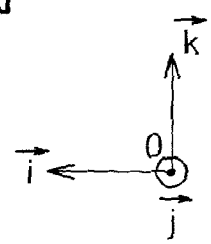
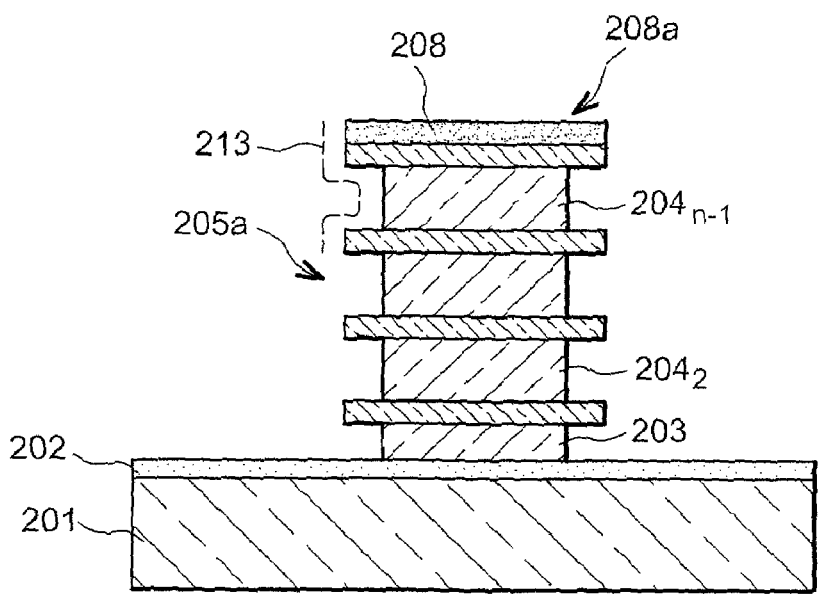
FIG. 3D
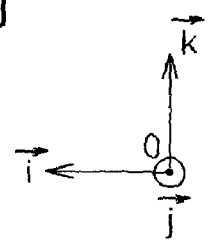

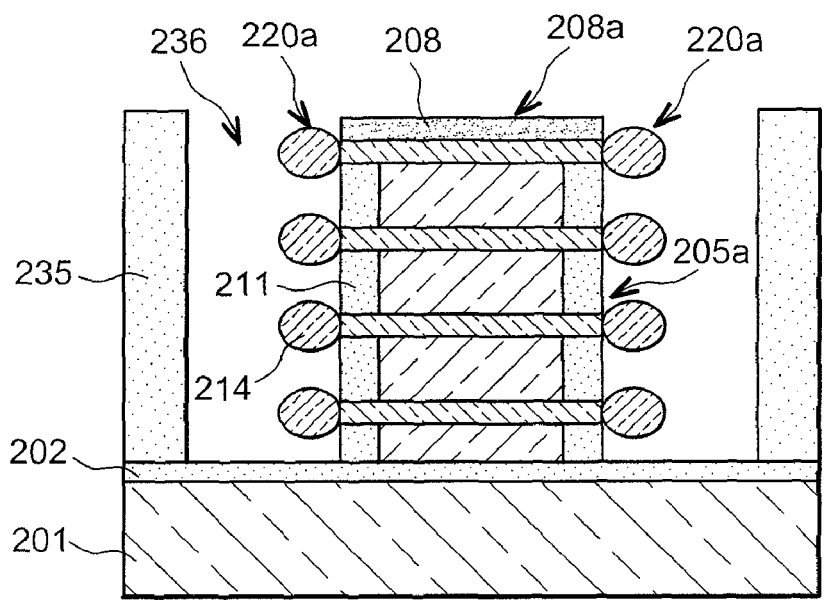
FIG. 3G
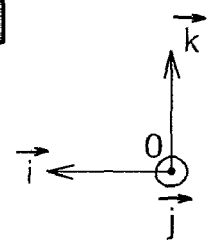
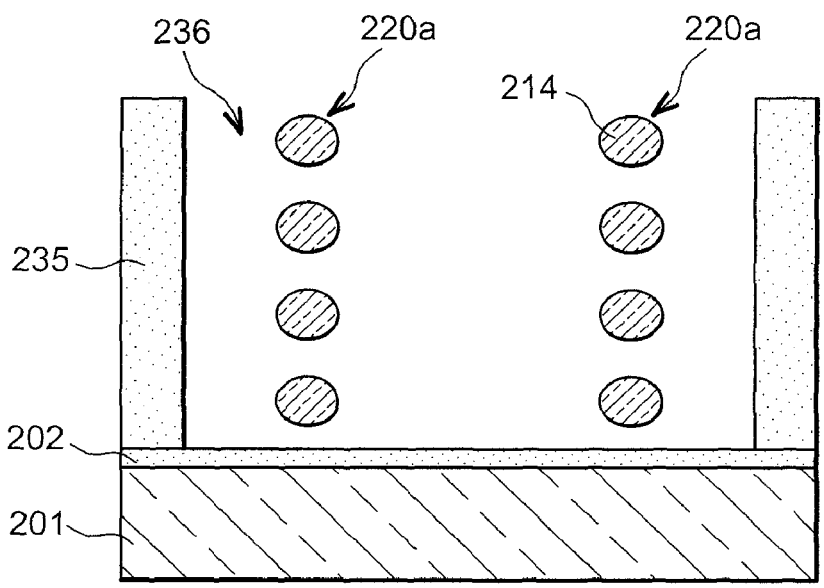
FIG. 3H
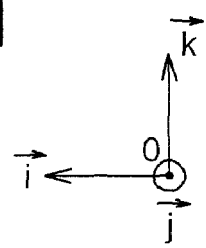

STRUCTURE AND METHOD FOR REALIZING A MICROELECTRONIC DEVICE PROVIDED WITH A NUMBER OF QUANTUM WIRES CAPABLE OF FORMING ONE OR MORE TRANSISTOR CHANNELS

TECHNICAL AREA

The present invention relates to the field of integrated circuits and more specifically to the field of transistors, and its objective is to present a microelectronic device provided in particular with one or more quantum wires that are optimized in terms of arrangement, shape or/and composition, and able to form a transistor channel, a transistor channel with several branches, or several transistor channels having improved electric performance and bulkiness.

PRIOR ART

A conventional transistor structure formed on a substrate, e.g. of SOI type (<<Silicon On Insulator>>), generally consists of a source region and drain region in the form for example of respective first and second semiconductor regions, joined together by a third semiconductor region or channel which may be in the shape of a bar or parallelepiped block. This bar is coated with a gate enabling control over the intensity of a current transiting between the source region and the drain region.

It is continually sought to improve the performance of transistors by endeavouring to improve two factors that are normally incompatible: their operating speed and their consumption.

To increase operating speed, it is attempted in particular to reduce the size of transistors, thereby also making it possible to reduce operating costs and to obtain integrated circuits with a higher number of transistors or higher transistor integration density.

Reducing the size of transistors entails shortening the distance between the source and drain for example, and forming channels of increasingly smaller length and width. This trend can lead to effects that are harmful to the proper functioning of transistors, such as <<short channel effects>>. Therefore, with increasingly shorter transistor channel lengths, the drain and source have an increasing influence on channel conduction, normally controlled by the gate. <<Short channel effects>> lead inter alia to a reduction in threshold voltage, reducing with channel length and drain voltage, which in turn leads to increased off-state leakage of the transistor. This is hardly compatible with an improvement in the performances of integrated circuits.

Document U.S. Pat. No. 6,127,702 proposes a transistor structure comprising a channel formed of several parallel parallelepiped bars juxtaposed on a substrate, and separated from each other by a distance determined by lithography. With this structure it is possible in particular to reduce short channel effects, but it nonetheless raises problems, particularly in terms of integration density, this density being limited by the lithography method.

Document U.S. Pat. No. 5,965,914 proposes another transistor structure, this time provided with a channel formed of superimposed, parallelepiped bars. Said structure is complex to implement, but also allows short channel effects to be improved, and brings improvements in terms of integration density, insofar as the space it takes up on a substrate is smaller than with the transistor structures previously described.

The problem is raised of finding a novel transistor structure, in which compactness problems on a substrate are further reduced, whilst achieving improved channel control.

DESCRIPTION OF THE INVENTION

The object of the present invention is to present a field effect microelectronic device comprising one or more wires, called <<quantum>> wires, that are optimized in terms of arrangement, shape or/and composition, and are able to form an improved transistor channel, or channel with several branches, or several transistor channels. These wires, forming one or more transistor channels, have an arrangement, and a shape or/and a composition bringing improvements to field effect transistors, in particular in terms of integration density and electrical performance.

The invention also provides a method for fabricating a microelectronic device having one or more bars or rods or wires, called <<quantum wires>> able to form a transistor channel or a transistor channel with several branches or several transistor channels, the method comprising the steps of:

a) the forming, in one or more thin layers, of at least one first block and at least one second block in which respectively at least one transistor drain region and at least one transistor source region are intended to be formed, and of at least one third block or structure joining the first block to the second block, b) forming on the surface, in particular on at least one side or on at least one lateral face of the structure, one or more wires linking a first region or a first face of the first block with another region or another face of the second block, able to form a transistor channel or channel with several branches or several transistor channels.

Said first region of the first block may be located facing said other region of the second block.

The first block, the second block and the third block may be formed in a stack of thin layers.

The method may also additionally comprise, after step b): the removal of at least part of the structure connecting the first block to the second block, this removal being selective with respect to the wires.

Therefore, the third block can be intended to act as support structure for the formation of quantum wires. The third block may optionally have a conventional transistor channel shape and may be eliminated or partly eliminated to leave way for the quantum wires that are optimized in terms of arrangement, shape or/and composition, and are able to form an improved channel structure or channel structure with several branches.

The wires formed at step b) may have an optimized shape, in particular they may be cylindrical or substantially cylindrical.

According to one possibility, the wires formed at step b) may be provided with a rounded or curved profile. According to several possibilities, the wires may be provided with a circular section or substantially circular section, or an oval section or substantially oval section.

The quantum wires may optionally be provided with a section containing at least one recess or/and at least one flat surface.

According to another possible implementation of the method, the first region of the first block and said other region of the second block may be made of one or more materials that are different from the material in which the wires are formed in step b).

According to one variant of implementation of the method, which may optionally be combined with the preceding implementations, separate or disjoined wires may be formed at step b).

According to another variant of implementation of the method, which may optionally be combined with the preceding variants, one or more separate wires or unattached to the support may be formed at step b).

Step a) to fabricate the first, second and third block may comprise the steps of:
  forming at least one mask on said stack,
  anisotropic etching of the stack through the mask. This mask is able to reproduce at least one transistor source pattern, at least one transistor drain pattern, and at least one pattern connecting the source pattern to the drain pattern.

In step b), the wires may be made by growth or selective growth of at least one semiconductor material around or either side of one or more given or targeted layers of the stack. This can in particular enable the formation of several quantum wires that are superimposed and/or separate and/or not joined to the support, and optionally at least two quantum wires aligned in a direction parallel to the main plane of the support and not joined to the support.

The stack may be formed of at least two successive layers in different materials, or of at least one pair of successive layers in different materials.

The stack may be formed of alternate layers of a first semiconductor material, and other layers of a second material, different from the first material.

According to one possible embodiment in which the stack is formed of one or more layers in a first material, and of one or more other layers in a second material, the method may also comprise after step b) and before step c), the steps of:
  partial etching of the layers in the first material, being selective in regard to the second material,
  formation of an insulating thickness around the layers in the first material. This allows some layers of the stack to be protected with an insulating material, for the subsequent selective growth of quantum wires on other layers of this stack.

According to one particular embodiment of the method, step b) can be conducted by growth or epitaxial growth, on some layers of the stack e.g. the layers in the second semiconductor material, of a third semiconductor material, the third material being different from the first material and/or the second material.

The fabrication method may also, after step c), comprise the steps of:
  depositing an insulating layer on the structure,
  forming at least one opening in the insulation layer between the first block and the second block, exposing the structure and the wires or exposing part of the structure and some wires,
  etching the structure through the opening, that is selective with respect to the wires.

This can, in particular, allow for at least partial removal of the structure, whilst preserving the first block and the second block. This can also, in particular when the opening is in the form of a transistor gate, allow for preparing the formation of this gate.

Therefore, the method may also comprise: after etching the structure through the opening, the formation of a transistor gate in the opening.

The method may optionally be conducted on a substrate of semiconductor-on-insulator type. In this case, the support may be formed for example of at least one layer acting as mechanical support e.g. semiconductor or quartz-based, and of at least one insulating layer resting on the semiconductor layer and on which the stack of thin layers formed in step a) is made.

For this purpose, according to one first aspect, the invention concerns a microelectronic device comprising:
  a support,
  at least one first block and at least one second block resting on the support, in which respectively at least one transistor drain region and at least one transistor source region are able to be formed or are formed,
  one or more bars or wires of cylindrical shape or substantially cylindrical shape, able to form or forming a transistor channel or a transistor channel with several branches or several transistor channels, connecting a first region of the first block to another region of the second block.

The first region of the first block and said other region of the second block may be located facing one another.

The wires may have a rounded or curved profile. According to several possibilities, the wires may be provided with a circular section or substantially circular section, or with an oval section or substantially oval section.

According to one possible embodiment of the quantum wires, these may be provided with a profile having at least one recess or/and at least one flat surface.

Therefore, the microelectronic device of the invention comprises quantum wires having an optimized arrangement and shape, cylindrical in particular, which allows improved control over the conduction of a channel, of a channel with several branches or of several channels which these wires are able to form.

The first block and the second block may respectively comprise one or more thin layers, including one or more semiconductor layers, e.g. a stack of semiconductor layers.

According to one possible embodiment of said device, the wires may be attached to a portion of the first region of the first block and to another portion of said other region of the second block, in a material or materials different to the material or materials of the wires. The microelectronic device of the invention can therefore comprise quantum wires in a given material, having good qualities in terms of charge carrier mobility, and connecting a drain region and a source region in a material or materials different to said given material.

According to one variant of embodiment, one of the quantum wires or several of the quantum wires, even all the quantum wires, of the device may be separate or disjoined or not in contact with the support. Said arrangement makes it possible to improve control over the conduction of the quantum wires by a gate coated on these wires.

According to a second possible arrangement, which may be combined with the preceding arrangement, the device may comprise at least two quantum wires aligned in a direction forming a nonzero angle with a main plane of the support. Said arrangement makes it possible to improve the compactness of a device having several quantum wires, and to improve the integration density of transistors.

According to a third possible arrangement, which may be combined with the two preceding arrangements, the device may comprise at least one two wires aligned in a direction parallel to the main plane of the support.

The first block and the second block may each comprise at least two semiconductor layers in different materials, with at least one layer in a first semiconductor material and at least one layer in a second semiconductor material, optionally able to be etched selectively with respect to the first material.

According to one particular embodiment of the device, the first block and the second block may comprise alternate layers in a first semiconductor material and a second semiconductor material different from the first semiconductor material.

The quantum wires may be in one semiconductor material and optionally in a third semiconductor material different from the first semiconductor material and from the second semiconductor material. This third material may be a material which particularly favours the mobility of the charge carriers, such as germanium for example, or/and a material which can be selectively etched with respect to the first and second semiconductor materials.

The device of the invention may also comprise a gate coating said wires at least in part. In this case, according to a variant of embodiment of the device, the support and the wires may be separated by a portion of gate.

The quantum wires of the device may optionally be of substantially cylindrical shape and comprise a flat surface, which may optionally indicate the manner in which these wires were formed. This flat surface may be such that it forms a nonzero or orthogonal angle with a main plane of the support.

According to one possible embodiment of the microelectronic device of the invention, this device may be fabricated from a substrate of semiconductor-on-insulator type. In this case, the support which the first block and second block rest upon may comprise at least one insulating layer in contact with the first and second block, and at least one semiconductor layer which the insulating layer rests upon.

According to a second aspect, the invention also concerns a microelectronic device comprising:
 a support,
 at least one first block and at least one second block of one or more thin layers resting on the support, in which respectively at least one transistor drain region and at least one transistor source region are intended to be formed,
 one or more bars or wires called <<quantum wires>> in at least one given material, able to form a transistor channel or several transistor channels, and connecting a first region of the first block and another region of the second block facing said first region, said first region of the first block and/or said other region of the second block being in a material different from said given material.

According to one particular embodiment of this device, the wires may be of cylindrical or substantially cylindrical shape.

According to one possibility, the wires may be provided with a rounded or curved profile.

BRIEF DESCRIPTION OF THE DRAWINGS

The present invention will be better understood on reading the description of examples of embodiment given solely for indication purposes and which are in no way limiting, with reference to the appended drawings in which:

FIGS. 3A to 3I are a cross-sectional illustration of the steps of a method for fabricating a microelectronic device of the invention.

Identical, similar or equivalent parts in the different figures carry the same reference numbers so as to facilitate cross-reading of the figures.

Figure 1A:
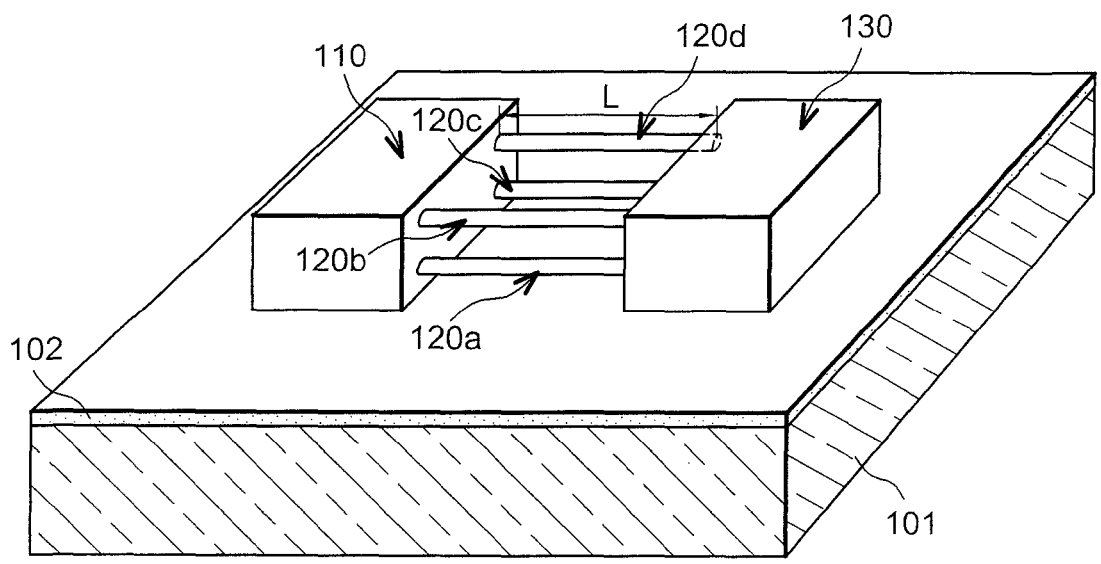
FIGS. 1A and 1B show an example of a microelectronic device according to the invention, comprising quantum wires able to form at least one transistor channel.

The different parts shown in the figures are not necessarily depicted on a uniform scale, for better legibility of the figures.

DETAILED DESCRIPTION OF PARTICULAR EMBODIMENTS

An example of a microelectronic device according to the invention will now be described with reference to FIGS. 1A and 1B.

This device firstly comprises a substrate, which may be of semiconductor-on-insulator type (SOI) or of SiGeOI type (<<SiGe On Insulator>>), and provided in particular with a first mechanical support layer 101 which may be in quartz or a semiconductor material e.g. silicon, and an insulating or buried oxide layer 102 in $SiO_2$ for example which rests on the first layer 101.

The insulating layer 102 acts as support for a first block 110 and for a second block 130, each formed of at least one thin layer or of several thin layers stacked on the insulating layer 102. The first block 110 and the second block 130 each comprise a semiconductor layer or several superimposed semiconductor layers, of which at least one semiconductor layer (not referenced) is in contact with the insulating layer 102.

The blocks 110 and 130 are intended respectively to form a transistor drain region or optionally several superimposed drain regions, and a transistor source region or optionally several superimposed source regions. Therefore blocks 110 and 130 may optionally each comprise several superimposed or stacked semiconductor layers in different semiconductor materials.

According to one possible embodiment of the device, the blocks 110 and 130 may each comprise alternate semiconductor layers in a first semiconductor material e.g. SiGe, and a second semiconductor material e.g. Si.

The blocks 110 and 130 may have respective bases in contact with the insulating layer 102 that are advantageously separate or disjoined. The blocks 110 and 130 are also joined to each other by one or more bars, rods or wires, e.g. as shown in FIG. 1A (giving a perspective view of the device) four bars or wires 120a, 120b, 120c, 120d.

The wires or bars 120a, 120b, 120c, 120d, are able to ensure electric conduction and are intended to form a transistor channel structure with several branches. In one particular case in which blocks 110 and 130 respectively form several stacked transistor drain regions and several stacked transistor source regions, the wires 120a, 120b, 120c, 120d may be intended to form several different transistor channels.

These bars or wires 120a, 120b, 120c, 120d, which we will also call <<quantum wires>> herein, and in the direction of their length L (length L being defined in FIG. 1A in a direction parallel to the vector $\vec{j}$ of an orthogonal reference point [o; $\vec{i}$; $\vec{j}$; $\vec{k}$]), connect a first face or a first region belonging to the first block 110 with another first face or another first region belonging to the second block 130, lying opposite said first face of the first block 110. The length L of the bars or wires 120*a*, 120*b*, 120*c*, 120*d*, which also corresponds to a distance separating blocks 110 and 130, may measure between 10 nanometres and 1000 nanometres, or it may be in the order of 50 nanometres for example.

The arrangement of the quantum wires is optimized, and can allow improved electrical properties to be imparted to the transistor channel or transistor channels which these wires form or may form. One or more quantum wires of the microelectronic device may have been formed so that they do not come into contact with the support which blocks 110 and 130 rest upon. In the example illustrated FIGS. 1A and 1B, the wires or bars 120*a*, 120*b*, 120*c*, 120*d* are formed above the respective lower faces of blocks 110 and 130, and are not in contact with the insulating layer 102. One or more quantum wires of the microelectronic device may also have been formed so that they are not in contact with the upper face or top surface of blocks 110 and 130 in which the source and drain regions are made. In the example illustrated FIGS. 1A and 1B, the wires or bars 120*a*, 120*b*, 120*c*, 120*d* are formed underneath the respective upper faces of blocks 110 and 130, and are not in contact with the insulating layer 102.

The arrangement of the quantum wires can also be optimized with regard to the space or room which they take up on the substrate. As shown FIG. 1B (giving a cross-sectional view between the first block 110 and the second block 130 of the device), a first wire 120*a* and a second wire 120*b* are aligned in a direction forming a nonzero angle, e.g. 90°, with the main plane of the semiconductor layer 101 or of the insulating layer 102. In a direction substantially parallel to the main plane of the insulating layer 102, are a third semiconductor wire 120*c* and a fourth semiconductor wire 120*d*, which are respectively aligned with the first wire 120*a* and with the second wire 120*b*.

The first wire 120*a*, and the second wire 120*b*, may be distanced apart by a distance $L_1$, e.g. of between 0 to 100 nanometres, or in the order of 20 nanometres for example and are preferably separate or disjoined.

The first wire 120*a* and the second wire 120*b* may respectively be distanced from the third semiconductor wire 120*c* and from the fourth semiconductor wire 120*d*, by a distance $L_2$, e.g. of between 10 nanometres to 100 nanometres, or in the order of 20 nanometres for example.

The quantum wires of the microelectronic device may also be of optimized shape to facilitate control over the conduction of the channel having several branches or over the channels which these wires are able to form. As shown FIGS. 1A and 1B, the wires 120*a*, 120*b*, 120*c*, 120*d* may be of cylindrical shape, in particular they may have a rounded or curved profile.

The cylindrical wires 120*a*, 120*b*, 120*c*, 120*d* may have a circular or so-called <<substantially>> circular section or, according to another possibility, they may have an ovoid section or so-called <<substantially ovoid>> section. The wires 120*a*, 120*b*, 120*c*, 120*d* having been made by a microelectronic method, e.g. by one or more epitaxy steps, they do not necessarily have a perfect geometrical shape, and in particular a perfectly geometrical section.

According to one possibility, the wires 120*a*, 120*b*, 120*c*, 120*d* may comprise at least one flat surface, in particular a flat surface oriented in a direction forming a nonzero angle with the main plane of the insulating layer 102 (the main plane of the insulating layer 102 being a plane belonging to layer 102 and parallel to a plane [o; $\vec{i}$; $\vec{j}$] of the orthogonal reference point [o; $\vec{i}$; $\vec{j}$; $\vec{k}$] defined in FIGS. 1A and 1B).

The wires 120*a*, 120*b*, 120*c*, 120*d*, may also comprise a recess or notch, and in particular a recess or notch which extends in the direction of continuation of the wires (the direction of continuation of the wires being a direction parallel to the vector $\vec{j}$ of the orthogonal reference point [o; $\vec{i}$; $\vec{j}$; $\vec{k}$] defined in FIGS. 1A and 1B).

Figure 6A:
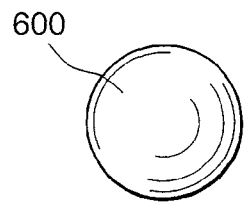
FIGS. 6A to 6H illustrate different examples of sectional shapes or cross-sections able to be assumed by the quantum wires of a microelectronic device according to the invention.
Figure 6B:
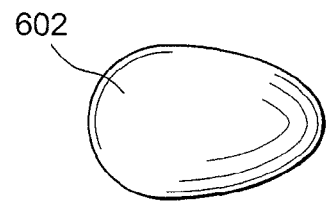
Figure 6C:
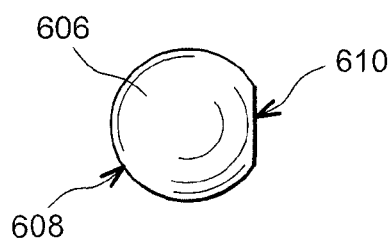
Figure 6D:
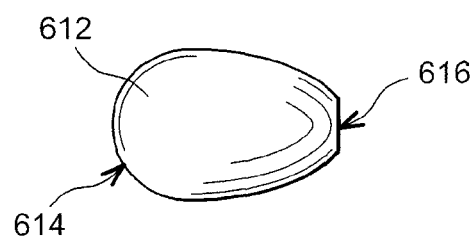
Figure 6E:
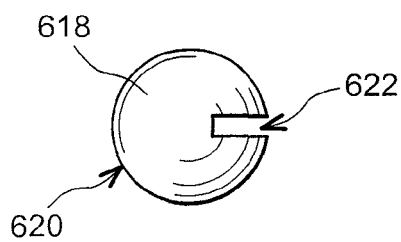
Figure 6F:
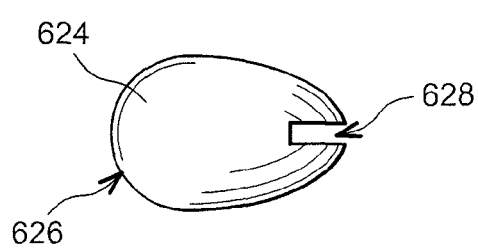
Figure 6G:
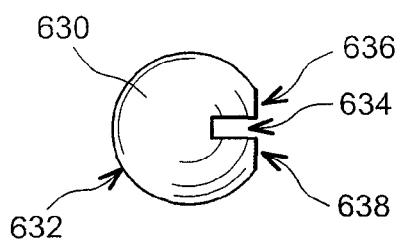
Figure 6H:
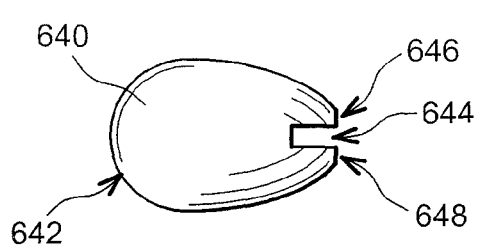

FIGS. 6A to 6H illustrate different examples of shapes of sections or cross sections which the wires 120*a*, 120*b*, 120*c*, 120*d*, are able to assume:

- a first example of a wire with circular section 600 is illustrated FIG. 6A,
- a second example of a wire with ovoid section 602 is illustrated FIG. 6B,
- a third example of a wire with a so-called <<substantially circular>> section 606 is illustrated FIG. 6C. This third example of a wire has a section 606 of which a larger portion of the contour or a larger part of the contour, denoted 608, is in the shape of an arc of a circle, while a smaller portion of the contour or a smaller part of the contour, denoted 610, is rectilinear and forms a flat surface for the wire,
- a fourth example of a wire having a so-called <<substantially ovoid>> section 612 is illustrated FIG. 6D. This fourth example of wire has a substantially ovoid section 612 of which a larger portion or larger part of the contour, denoted 614, is of oval shape, while a smaller portion or smaller part of the contour denoted 616 is rectilinear and forms a flat surface for the wire,
- a fifth example of a wire, having a so-called <<substantially circular>> section 618 is illustrated FIG. 6E. This fifth wire example has a section 618, of which a larger portion or larger part denoted 620 of the contour is in the shape of an arc of a circle, while a smaller portion or smaller part denoted 622 of the contour forms a recess or notch in the wire,
- a sixth wire example having a so-called <<substantially ovoid>> section 624 is illustrated FIG. 6F. This sixth wire example has a section 624 of which a larger portion of the contour or a larger part 626 of the contour has an oval shape, while a smaller portion of the contour or a smaller part 628 of the contour forms a recess or notch in the wire,
- a seventh example of wire, having a so-called <<substantially circular>> section 630 is illustrated FIG. 6G. This seventh example of wire has a section 630 of which a larger portion of the contour or a larger part 632 of the contour is in the shape of an arc of a circle, while a smaller portion or smaller part 634 of the contour forms both a recess or notch 634 in the wire and flat surfaces 636 and 638 either side of the recess 634,
- an eighth example of wire having a so-called <<substantially ovoid>> section 640 is illustrated FIG. 6H. This eighth wire example has a section 640 of which a larger portion of the contour or a larger part 642 of the contour is of oval shape, while a smaller portion of the contour of smaller part of the contour 644 forms both a recess or a notch 644 in the wire and flat surfaces 646 and 648 either side of the recess 644.

Figure 1B:
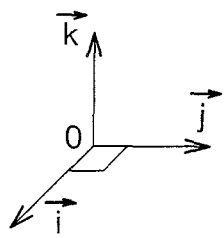
Figure 1B:
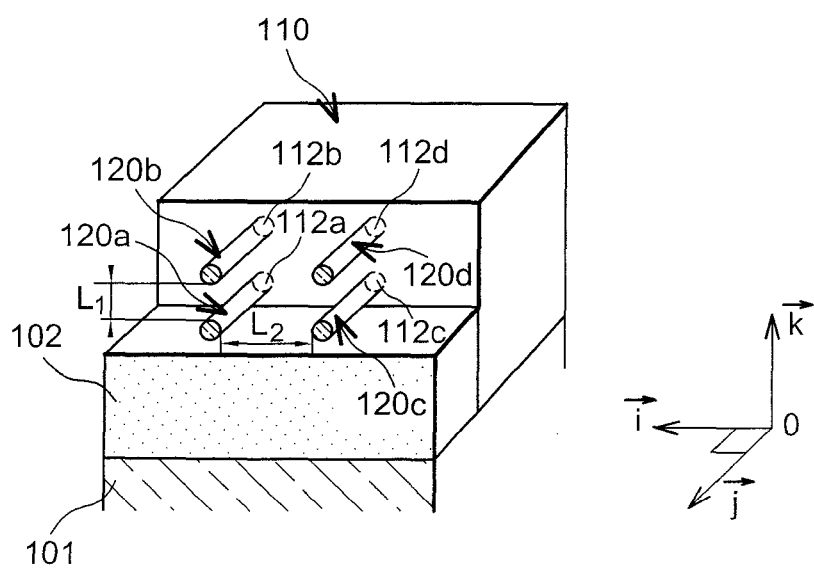

In the case when the bars or wires 120*a*, 120*b*, 120*c*, 120*d* are of cylindrical shape with circular base or have a substantially circular section, they may have a diameter d (the diameter d being defined in FIG. 1B in a direction parallel to the vector $\vec{i}$ of an orthogonal reference point [o; $\vec{i}$; $\vec{j}$; $\vec{k}$]) and lying between 1 and 15 nanometres for example, or being in the order of 5 nanometres for example.

Regarding the composition of the quantum wires, the wires or bars 120*a*, 120*b*, 120*c*, 120*d*, may have been fabricated in a third semiconductor material which may be different from the material or materials in which the blocks 110 and 130 are formed. In FIG. 1B for example, the wires or bars 120a, 120b, 120c, 120d may be in a material different from the material of portions 112a, 112b, 112c, 112d, of the block 110 to which these wires are respectively attached. The third semiconductor material may be a material chosen for its electrical performance characteristics, in particular in terms of mobility of the charge carriers, such as germanium for example.

Figure 2A:
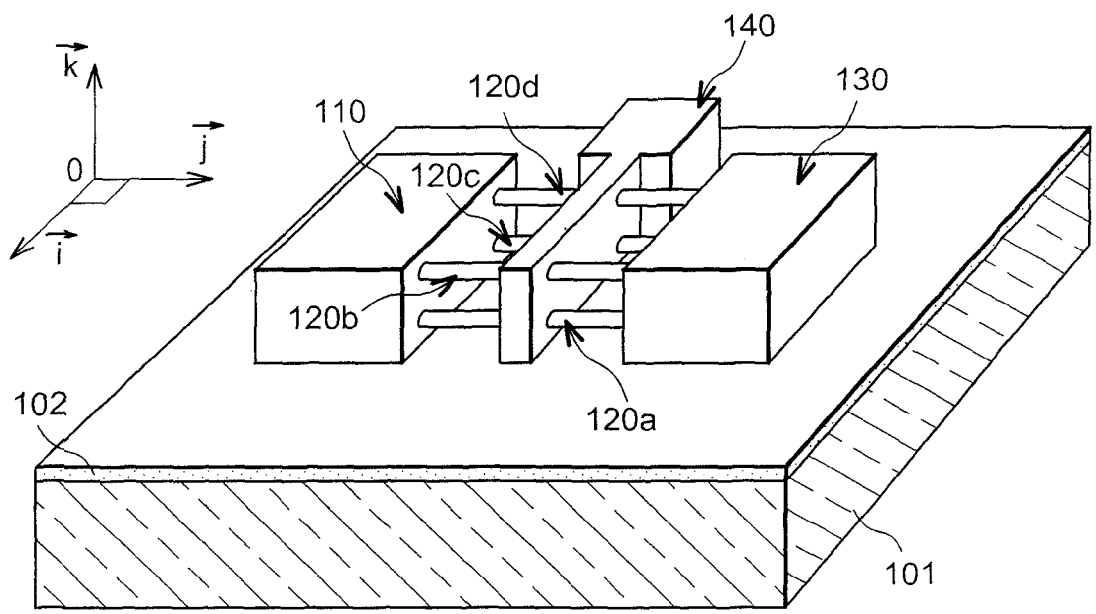
FIGS. 2A and 2B show a microelectronic device of the invention comprising one or more quantum wires coated with a gate, and forming at least one transistor channel.
Figure 2B:
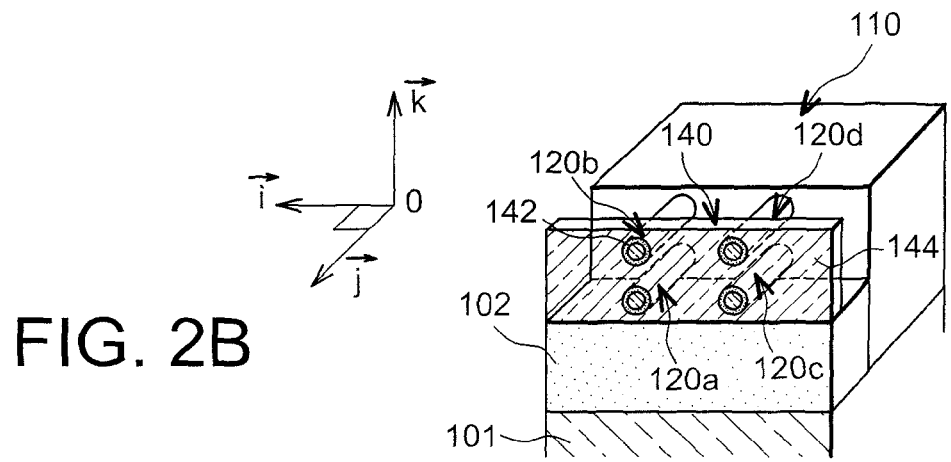

The device just described with reference to FIGS. 1A and 1B, may be completed by a gate 140 formed between blocks 110 and 130, which coats the wires 120a, 120b, 120c, 120d, and provides control over their conduction. This gate 140 may form a ring around the quantum wires 120a, 120b, 120c, 120d, over part of their length L, and may be formed so that it does not contact the blocks 110 and 130. A dielectric gate material 142, e.g. $SiO_2$ or a dielectric material commonly called <<high-k>> (with high dielectric constant k) such as $HfO_2$, $Al_2O_3$, or $ZrO_2$, and of possibly conformal thickness, e.g. between 0.5 and 5 nanometres, is formed around the wires 120a, 120b, 120c, 120d. That part of the wires 120a, 120b, 120c, 120d, surrounded by the dielectric 142, comes to be inserted in a semiconductor gate material 144 such as polysilicon for example or a conductive material such as TiN or W. Through the arrangement of the wires or bars 120a, 120b, 120c, 120d of the device, at the point between blocks 110 and 130 where the gate 140 is formed, the insulating layer 102 can be separated from each of the wires 120a, 120b, 120c, 120d by the dielectric 142 and the gate material 144, while the wires can be separated from each other by the dielectric 142 and the gate material 144 (FIGS. 2A and 2B, these figures respectively showing the device in FIG. 1A and the device in FIG. 1B to which a transistor gate 140 has been added).

One example of a method to fabricate a microelectronic device of the invention, of the type described above, will now be described.

Figure 3A:
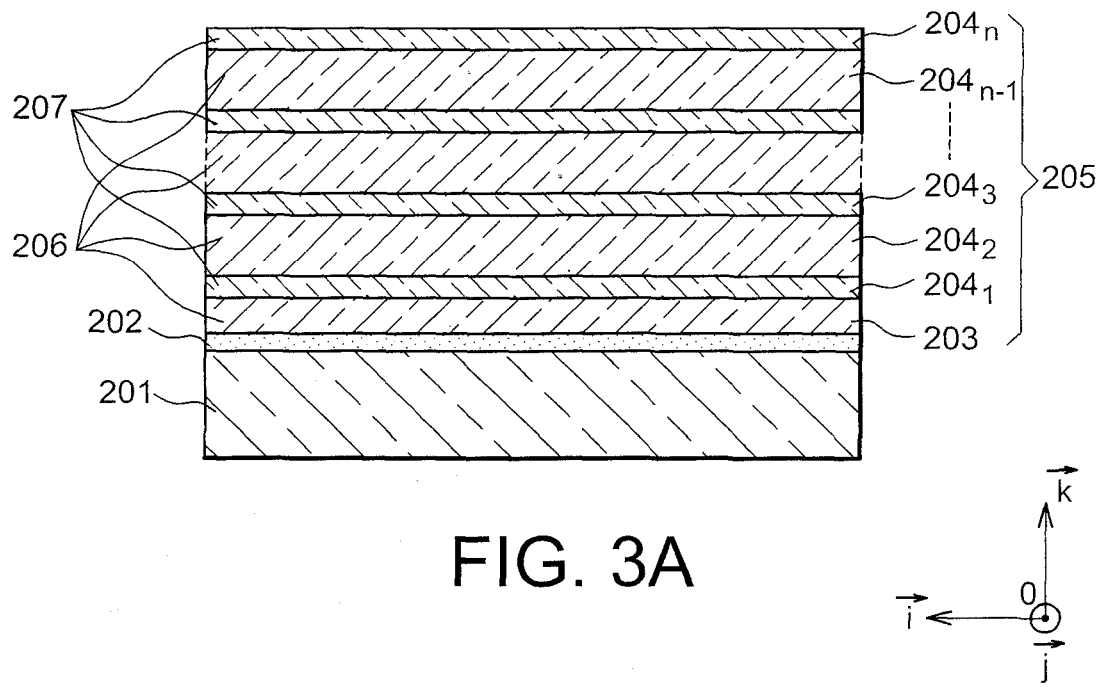

The first step of this method as illustrated FIG. 3A, consists of forming a stack of thin layers on a substrate, which may be of semiconductor-on-insulator type, and may comprise a first semiconductor layer 201 e.g. in silicon, on which rests an insulating layer 202 e.g. a buried oxide layer in $SiO_2$, itself covered by a second semiconductor layer 203. This second semiconductor layer 203 can for example be in silicon or SiGe. Several other layers $204_1, \ldots, 204_n$ (n being an integer, e.g. uneven) are formed on the second semiconductor layer 203 and, together with this second layer, form a stack 205 of thin layers on the insulating layer 202.

Layers $204_1, \ldots, 204_n$ may be semiconductor layers, formed for example by several successive epitaxies starting on the second semiconductor layer 203. Layers 203, $204_1, \ldots, 204_n$ have thicknesses (measured in a direction orthogonal to a main plane of the insulating layer 202 and parallel to the vector $\vec{k}$ of the reference point [O; $\vec{i}$; $\vec{j}$; $\vec{k}$] defined in FIG. 3A) ranging for example from 1 to 100 nanometres, or between 1 and 30 nanometres.

The stack 205 can be formed of alternate layers denoted 203, $204_2, 204_4, \ldots, 204_n$ in a first material 206, which may be semiconductive e.g. SiGe, and of layers denoted $204_1, 204_3, \ldots, 204_{n-1}$ in a second material 207, different from the first material 206. The first material 206 may be a material which can be selectively etched with respect to the second material 207. As for the second material 207, this may be a crystalline material promoting epitaxial growth e.g. a semiconductive material such as silicon, GaAs, or INP.

According to one possible embodiment, the layers 203, $204_2, \ldots, 204_{n-1}$ in the first material 206 may have a thickness $e_1$, for example of between 1 and 20 nanometres, being thicker than the layers $204_1, 204_3, \ldots, 204_n$ in the second material 207 whose thickness $e_2$, is for example between 1 and 15 nanometres.

Once the stack 205 has been formed, a hard mask layer 208 is deposited, e.g. in $Si_3N_4$ or $SiO_2$, or in another material able to protect the stack 205 from etching such as plasma etching for example. Then a photoresist layer 209 is deposited, e.g. in polyimide, on the hard mask layer 208, and in the photoresist layer, e.g. using a photolithography method, a resin mask is formed having a plurality of patterns.

Figure 5:
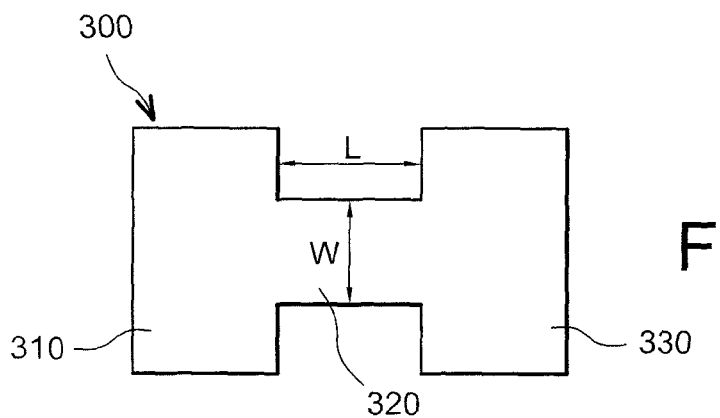
FIG. 5 shows a transistor pattern.
Figure 3B:
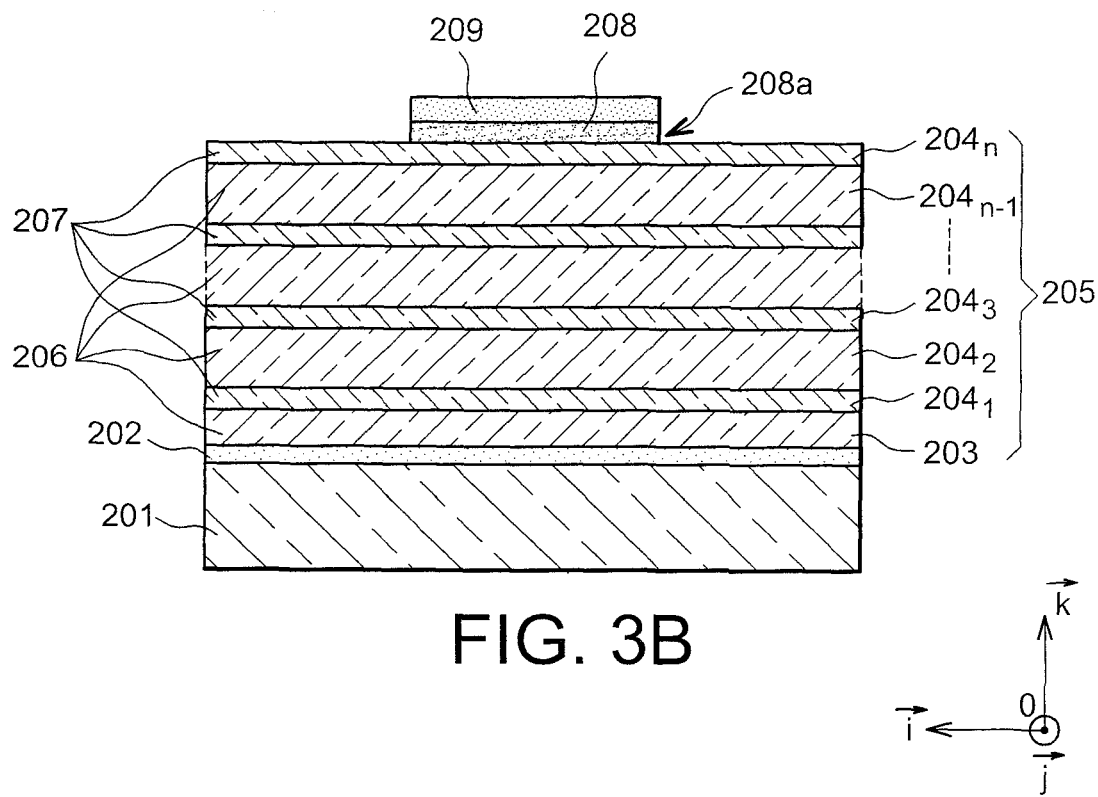

Anisotropic etching is then conducted on the hard mask layer 208 protected by the resin mask 209, in order to obtain a hard mask under the resin mask reproducing the latter's plurality of patterns (FIG. 3B). Among the plurality of patterns of the resin mask and hard mask are one or more patterns of the type shown FIG. 5, including at least one first drain region pattern 310 for a transistor 300, e.g. of rectangular shape, at least one second pattern of a source region 330 for a transistor 300 which may be similar to the drain region pattern, and at least one third pattern joining the first pattern 310 to the second pattern 330. The size and shape of the third pattern 320, may for example correspond to those of a conventional channel pattern for a transistor 300, such as a rectangular pattern of width W, e.g. lying between 10 nanometres and 1000 nanometres, and of length L, e.g. of between 5 nanometres and 1000 nanometres.

After forming the hard mask 208, the resin mask 209 may optionally be removed using a stripping method e.g. using an oxidizing plasma.

Figure 4A:
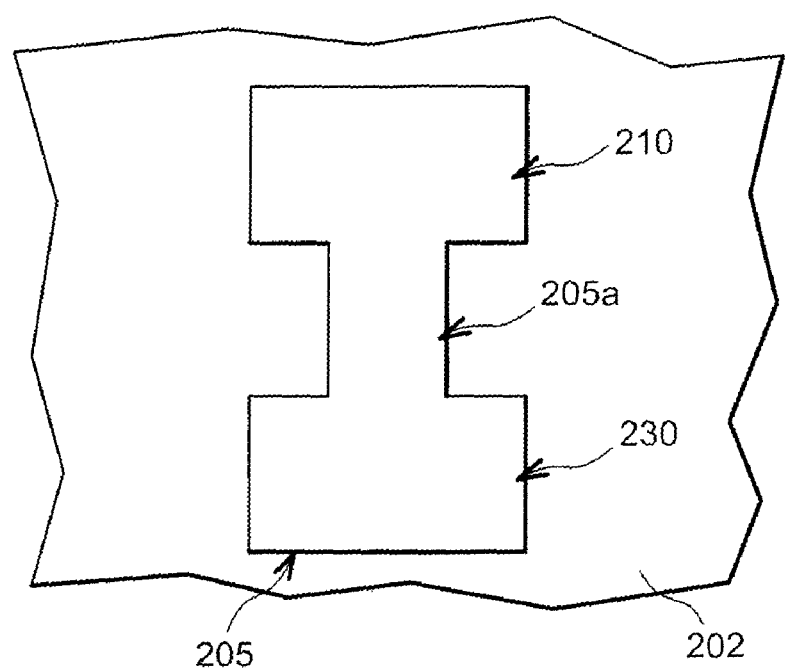
FIGS. 4A to 4E are an overhead illustration of the steps of this same method.

A first etching step is then performed of layers 203, $204_1, \ldots, 204_n$, located under the hard mask 208, so as to reproduce the patterns of this mask in the stack 205. Etching may be anisotropic e.g. using a $CF_4$, HBr, or $O_2$ plasma. FIG. 4A is an overhead view, without the hard mask 208, of the stack 205 after it has been etched. This stack 205 comprises in particular a first part or first block 210 reproducing the first pattern 310 and in which at least one active region, for example a source region, is intended to be formed, a second part or second block 230 reproducing the second pattern 330 and in which at least one active region e.g. a drain region is intended to be formed, and at least one third part 205a, reproducing the third pattern 320 joining the first block 210 to the second block 230. The third part 205a of the stack 205 forms a structure as shown in cross-section in FIG. 3C, consisting of a stack of parts of etched layers 203, $204_1, \ldots, 204_n$, located underneath the portion denoted 208a of the hard mask 208, and which reproduce the third pattern 320.

Subsequently, a second etching of the stack 205 can be carried out, which may be isotropic and selective so as to partly remove some of layers 203, $204_1, 204_2, \ldots, 204_n$, of the stack 205, for example the layers 203, $204_2, \ldots, 204_{n-1}$ in the first material 206.

If the layers 203, $204_2, \ldots, 204_{n-1}$, are in a first semiconductor material, such as SiGe, while layers $204_1, 204_3, \ldots, 204_n$ are in a second semiconductor material such as silicon for example, etching may be isotropic etching of the first semiconductor material, that is selective with respect to the second semiconductor material. Said etching may be performed for example using a fluorine-based plasma e.g. $CF_4$ or $NF_3$ in the case when the first material 206 is SiGe. In another case, in which the first material 206 is Si, the selective etching may be made for example using a plasma containing $CF_4 + CH_2F_2 + N_2 + O_2$.

The stack 205 being protected on its top surface by the hard mask 209, the second etching allows removal of portions of layers 203, $204_2, \ldots, 204_{n-1}$ in the first semiconductor material 206, either side of the structure 205a, at the sides or lateral faces of this structure (FIG. 3D, the sides or lateral faces of structure 205a being parts of this structure lying parallel to the plane [O; $\vec{j}$; $\vec{k}$] in this figure).

Preferably, the second selective etching step impacts the layers 203, $204_2$, $204_4$, . . . , $204_{n-1}$ in the first material 206 and leaves intact the other layers $204_1$, $204_3$, . . . , $204_n$ in the second material 207.

Figure 4B:
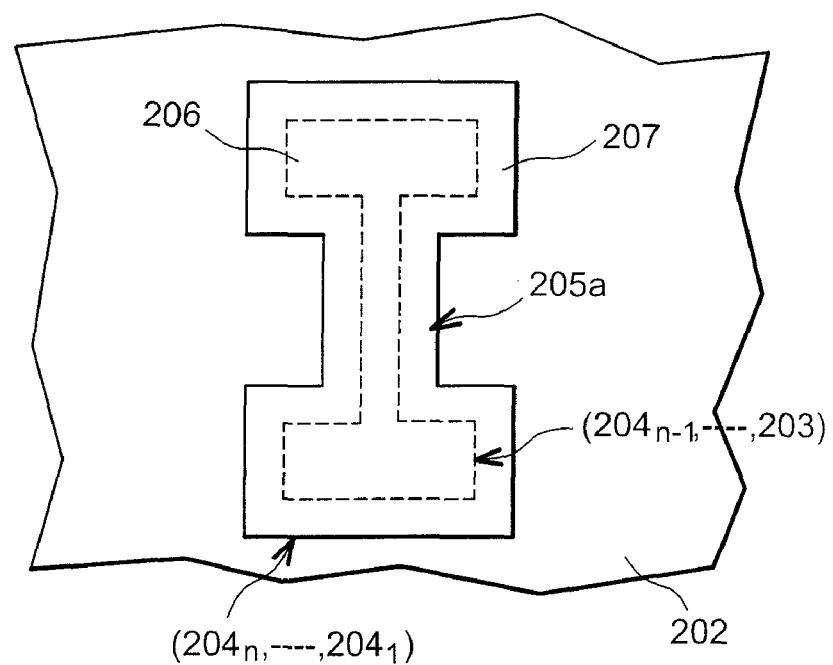

As shown FIG. 4B, giving an overhead view of the stack 205, without the hard mask 208 and after the second etching, the etched layers 203, $204_2$, $204_4$, . . . , $204_{n-1}$ do not extend as far as the other layers $204_1$, $204_3$, . . . , $204_{n-1}$ in the second semiconductor material (layers $204_2$, $204_4$, . . . , $204_{n-1}$ firstly and layers $204_1$, $204_3$, . . . , $204_{n-1}$ secondly, being respectively delimited in this FIG. 4B by a dashed line and a solid line).

As a result, after the second etching step, the stack 205 and in particular structure 205a comprises on its sides, or on each of its lateral faces, an indented profile 213 (shown as a dashed line in FIG. 3D). This indented profile 213 may be a notched profile. Depending on the quality of the previously described selective etching, the shape of the blocks of stacked layers forming structure 205a may be close to a perfectly parallelepiped shape. Stacked blocks having a shape close to a perfectly parallelepiped shape and having different widths form a crenellated profile.

Next, on the sides or lateral faces of structure 205a, insulating spacers 212 are formed so as to fill in, at least in part, those parts of layers 203, $204_2$, . . . , $204_{n-1}$ which were removed by selective etching of the stack 205. Advantageously the insulating spacers 212 fully fill those parts of layers 203, $204_2$, . . . , $204_{n-1}$, which were removed during selective etching of the stack 205.

The formation of these insulating spacers 212 can be made first by conformal deposit of a dielectric layer 211, in $Si_3N_4$ for example having a thickness of between 20 and 50 nanometres, on the stack 205 and in particular on the structure 205a, followed by partial isotropic etching of the deposited dielectric layer 211. This partial etching is made so as to preserve the dielectric layer 211 preferably only around those parts removed during the second etching step from layers 203, $204_2$, . . . , $204_{n-1}$, in the first material 206. The remaining thickness of the dielectric layer 211 then forms insulating spacers 212 either side of the structure 205a, on its sides or lateral faces. The thickness of the dielectric layer 211 which is maintained, may optionally be such so that after formation of the spacers 212, the structure 205a on its sides or lateral faces comprises a new planar or near-planar profile.

Figure 3E:
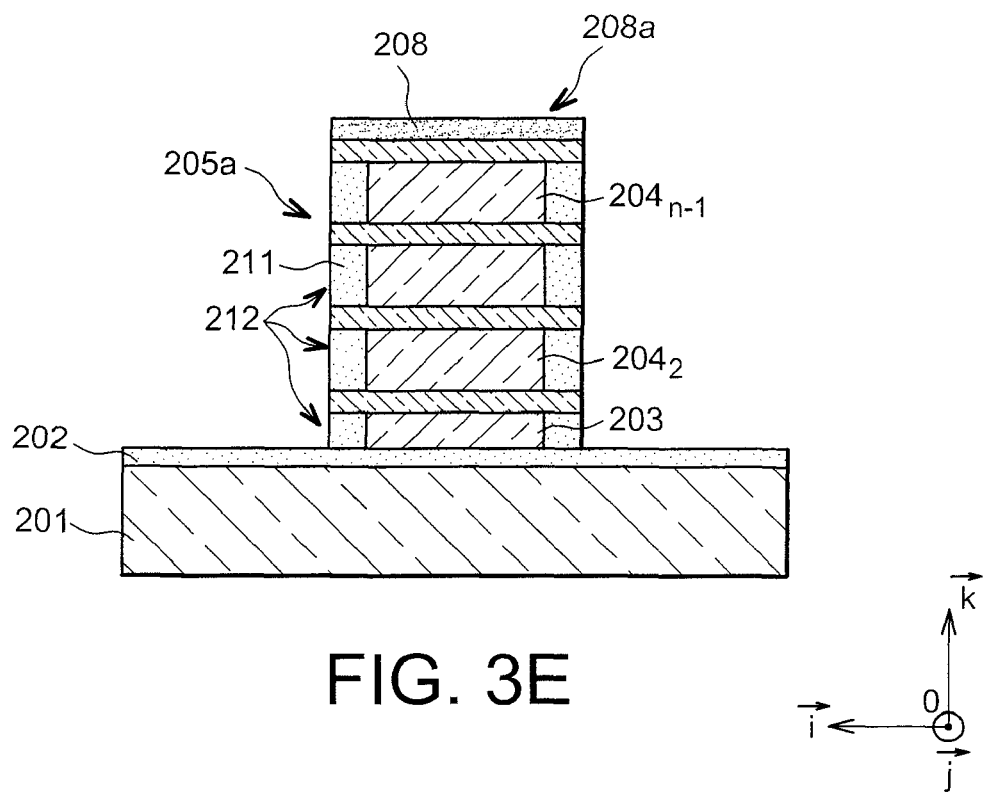

Subsequent to forming of the spacers 212, the stack 205, and in particular the structure 205a, is covered and protected on its top surface by part 208a of the hard mask 208, and on its sides or lateral faces has insulating regions or strips formed by the insulating spacers 212, alternating with semiconductor regions or strips formed by layers $204_1$, . . . , $204_n$ in the second semiconductor material 207 (FIG. 3E).

On each of the regions or strips formed by layers $204_1$, . . . , $204_{n-1}$, in the second semiconductor material 207, lying flush with the sides of the stack 205, a thickness is formed in a third semiconductor material 214 e.g. by epitaxial growth. This epitaxy of the third material 214 on the second material 207 is selective with respect to the insulating spacers 212.

Therefore, the regions in the second semiconductor material, located on the sides or lateral faces of the stack 205, may act as starting crystalline seed to grow semiconductor thicknesses 220 of between 1 to 15 nanometres for example, in a third semiconductor material 214. The thicknesses 220 may be in the shape of cylindrical or substantially cylindrical blocks, which surround the stack 205. Portions, denoted 220a, of these cylindrical blocks run along the sides or lateral faces of the structure 205a. These portions form cylindrical wires 220a or cylindrical bars 220a or cylindrical rods 220a, in particular having a rounded or curved profile which link the first part or first block 210 to the second part or second block 230 of the stack 205 (FIGS. 4C and 3F, these figures respectively showing an overhead view of the stack 205 without the hard mask 208, and a cross-sectional view of the structure 205a between the first part 210 and the second part 230 of the stack.

Figure 3F:
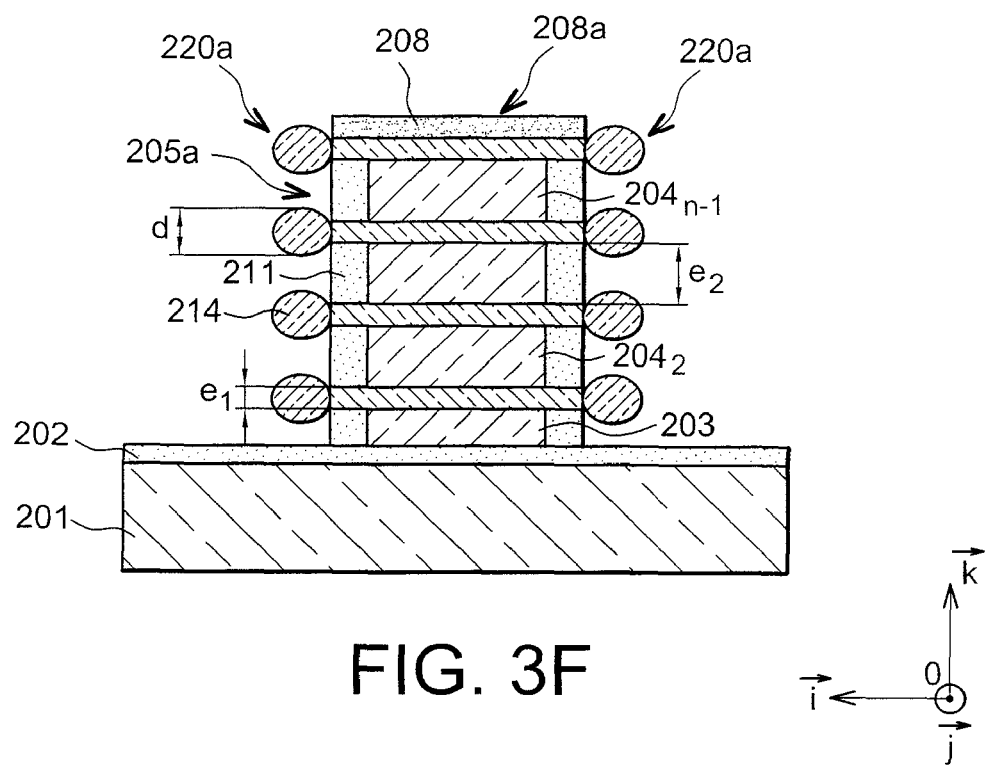
Figure 4C:
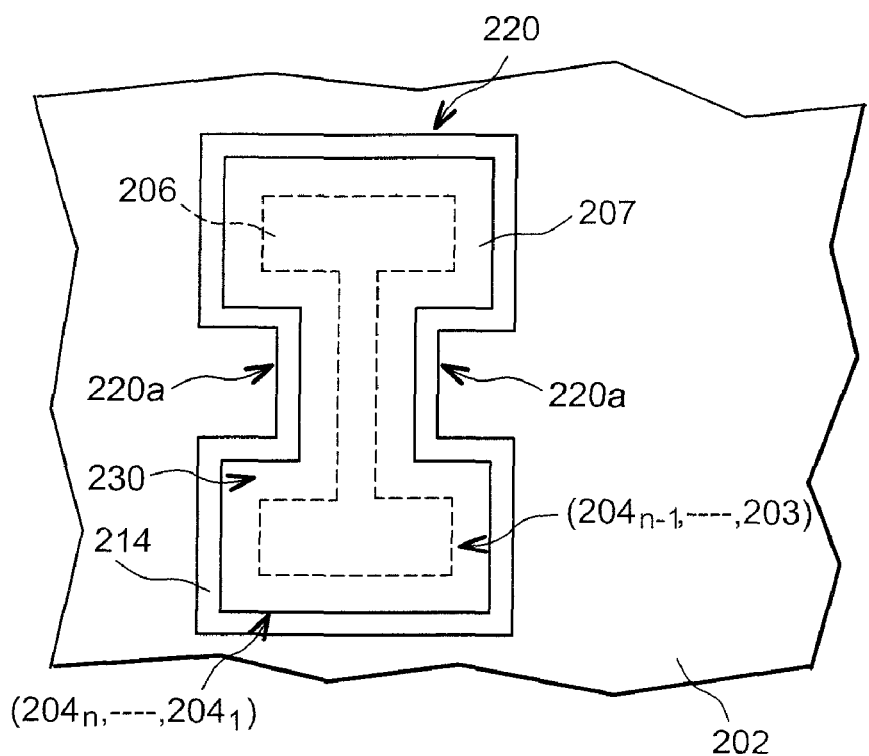

The cylindrical wires 220a, may for example be of circular section, as illustrated FIG. 3F or, according to another possibility, of ovoid section.

The wires 220a being fabricated using a microelectronic method, e.g. using epitaxial growth, they do not necessarily have a perfect geometric shape, and in particular a section of perfect geometric shape. Therefore at the interface with layers $204_1$, . . . , $204_{n-1}$ in the second material 207 on which the wires 220a were formed, these wires 220a may comprise at least one flat surface or/and a notch or recess.

FIGS. 7A to 7F illustrate different variants of sectional shapes which the wires 220a are able to assume. These sectional shapes may depend in particular on the profile of the sides or lateral faces of the structure 205a.

Figure 7A:
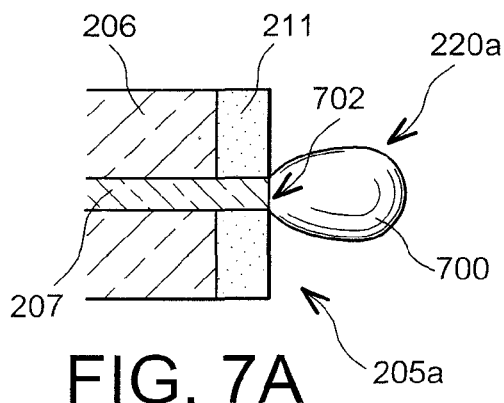
FIGS. 7A to 7F illustrate different variants of sectional shapes of quantum wires obtained using a method for fabricating a microelectronic device according to the invention.
Figure 7B:
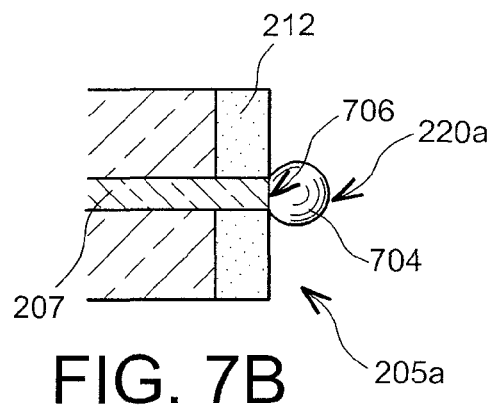

FIGS. 7A and 7B (each giving a cross-sectional view of part of the structure 205a between the first part 210 and the second part 230 of the stack 205) respectively illustrate an example of a wire having a substantially ovoid section 700 and a flat surface 702 against the structure 205a, and another example of a wire having a substantially circular section 704 and a flat surface 706 against the structure 205a.

Figure 7C:
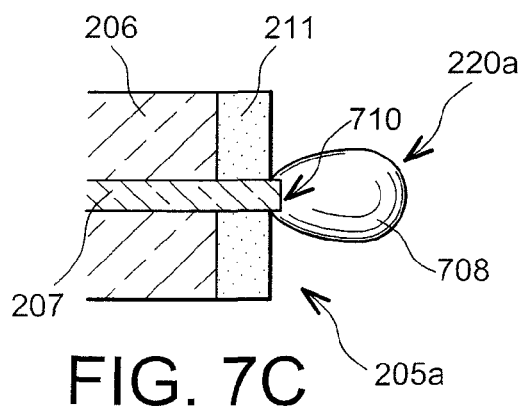
Figure 7D:
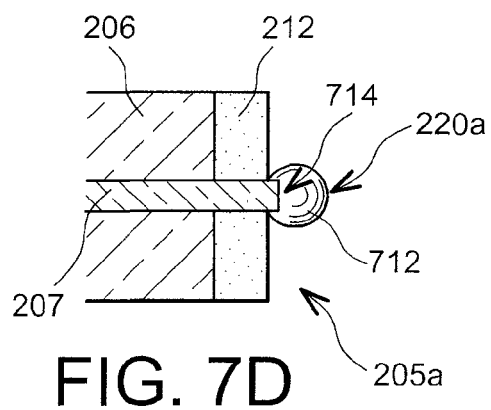

FIGS. 7C and 7D (each giving a cross-sectional view of part of the structure 205a between the first part 210 and the second part 230 of the stack 205) respectively illustrate an example of a wire having a substantially ovoid section 708 and a recess or notch 710, and another example of a wire 220a provided with a substantially circular section 712 and a recess or notch 714.

Figure 7E:
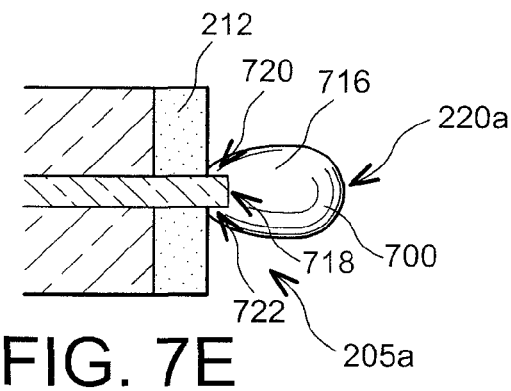
Figure 7F:
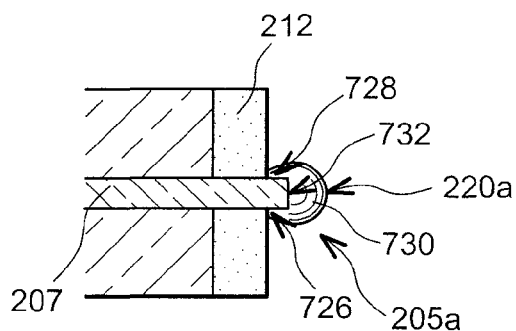

FIGS. 7E and 7F (each giving a cross-sectional view of part of the structure 205a between the first part 210 and the second part 230 of the stack 205) respectively illustrate an example of a wire 220a provided with a substantially ovoid section 716 and a notch 718 with flat surfaces 720 and 722 either side of the notch 718, and another example of a wire 220a having a substantially circular section 730 and a notch 732 with flat surfaces 734 and 736 either side of the notch 732.

The third semiconductor material 214, in which the wires 220a are formed, may be different from the first semiconductor material 206 and the second semiconductor material 207 in which layers 203, $204_2$, . . . , $204_n$ firstly and layers $204_1$, $204_3$, . . . , $204_{n-1}$ secondly are respectively formed. This third semiconductor material 214 may be a material chosen for its electric performance, in particular in terms of mobility of the charge carriers, e.g. Germanium.

The rods 220a or bars 220a or wires 220a, connecting blocks 210 and 230 in which a source region and a drain region are respectively intended to be formed, these wires 220a are intended to act as quantum wires and to form a transistor channel structure with several branches or optionally several transistor channels.

The stack 205 is subsequently coated with an insulating layer 235, e.g. in $SiO_2$, or HTO oxide (<<High Temperature Oxide>>) or $Si_3N_4$. This insulating layer 235 may be given a thickness that is greater than the height of the stack 205, so that it entirely covers this stack.

A cavity 236 is then made in the insulating layer 235. As shown FIG. 4D (showing an overhead view of the stack 205, without the mask 208), covered by the insulating layer 235, the cavity 236 may have a pattern and location corresponding to those of a transistor gate.

Figure 4D:
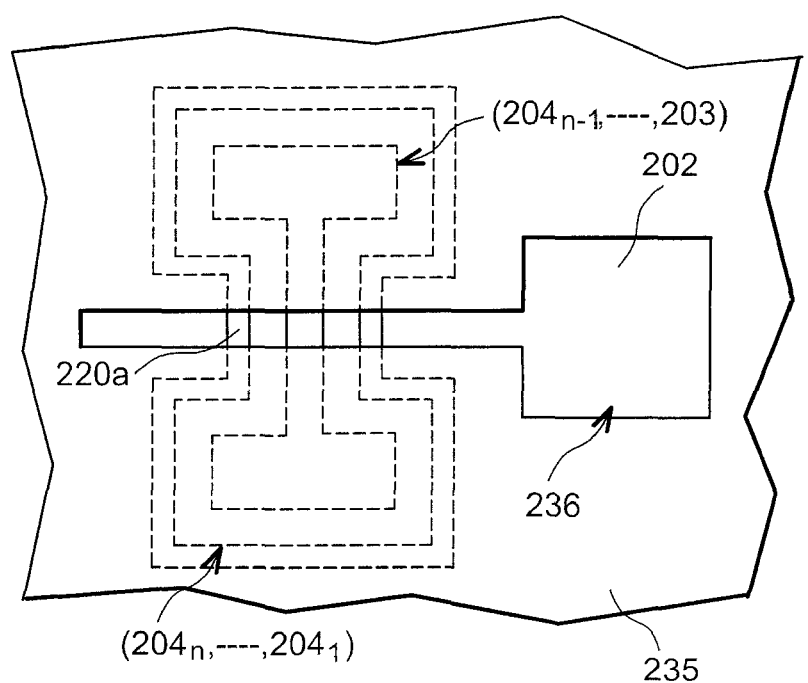

The cavity 236 can be made for example using photolithography and etching steps, so as to expose the insulating layer 202 of the substrate 201, at least part of the structure 205a, and a portion of the wires 220a formed either side of the structure (FIG. 4D and FIG. 3G).

Those parts of the structure 205a exposed by the cavity 236 are then removed. On the other hand, those portions or parts of wires 220a exposed by the cavity 236 are maintained.

For this removal operation, it is possible first to remove from the cavity 236 the dielectric material 211 forming the spacers 212, via chemical etching e.g. using an aqueous $H_3PO_4$ solution. According to another possibility, this removal can be made using a plasma, e.g. a $CF_4+CH_2F_2+N_2+O_2$ plasma, followed by etching that is selective with respect to the third semiconductor material.

Figure 4E:
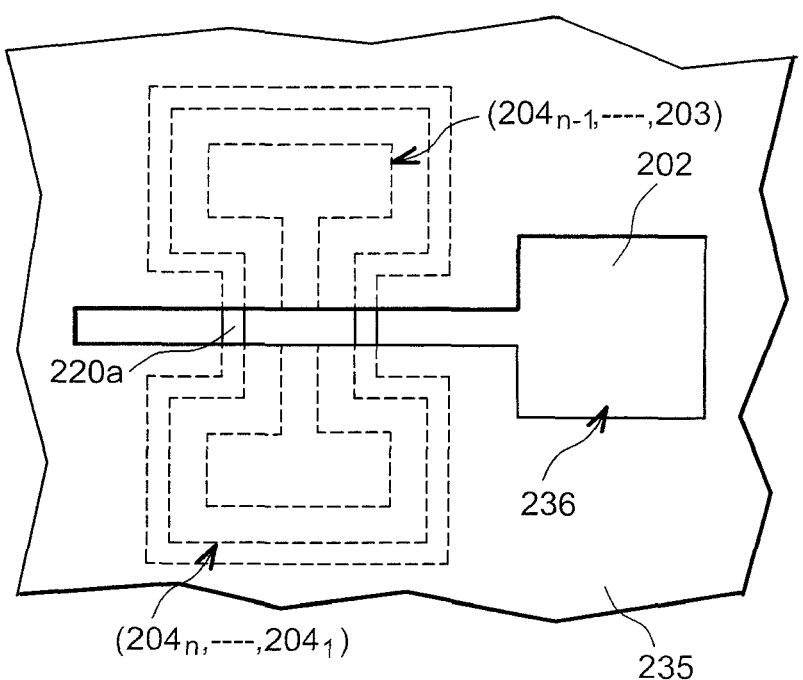

This selective etching in regard to the third semiconductor material may for example be dry etching or chemical etching using TMAH for example (Tetra-methyl ammonium hydroxyl). Solely those portions of wires or bars 220a exposed by the cavity 236, are maintained in the cavity (FIG. 4E, this figure giving an overhead view of the stack 205, covered by the insulating layer 235).

As shown FIG. 3H (this figure giving a cross-sectional view of the stack 205 between the first part 210 of this stack and the second part 230 of this stack, in which a drain region and a source region are respectively intended to be formed) subsequent to removal of structure 205a in the cavity 236, the portions of wires 220a located in the cavity 236 are cropped and hang inside this cavity 236.

A gate 240 can then be made in the cavity 236, using a Damascene method, during which first an insulator 242 is deposited around the portions of wires 220a exposed by the cavity 236. This deposit may be a conformal deposit having a thickness in the order of 1 to 10 nanometres for example, and may be made in $SiO_2$ for example or a dielectric material of the type commonly called <<high-k>> such as $HfO_2$.

Figure 3I:
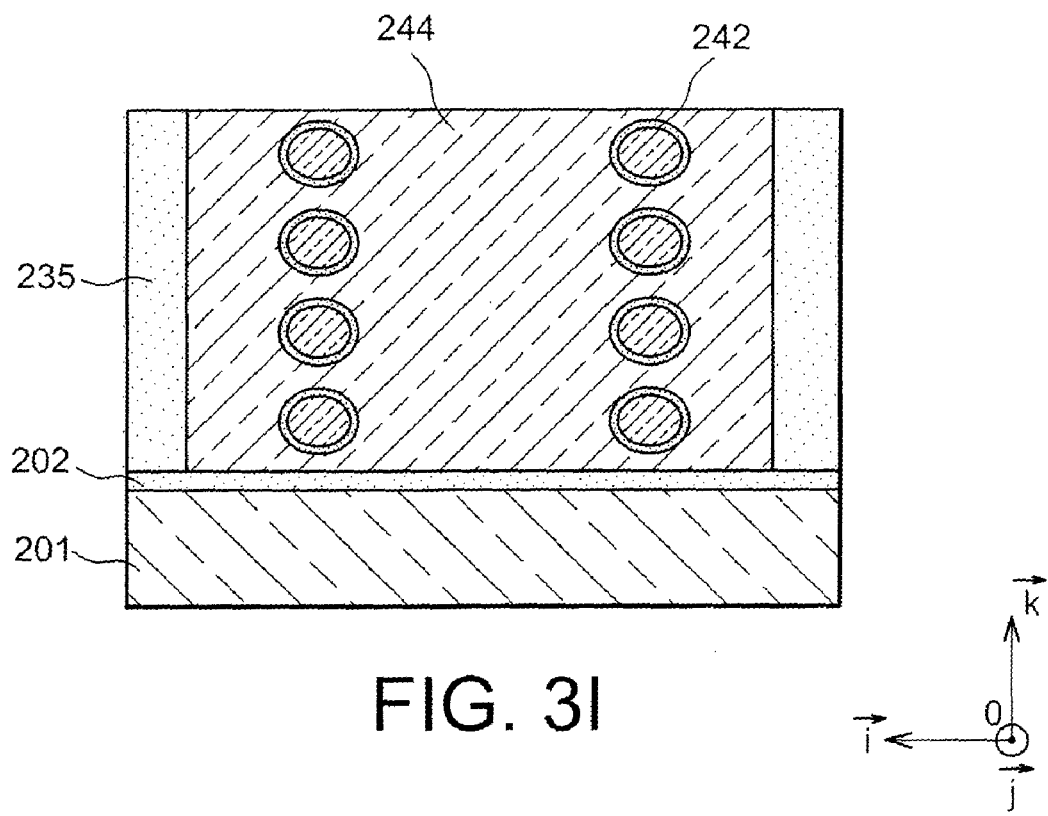

Next, the cavity 236 is filled with a gate material 244, which may be a semiconductor material such as polysilicon, or a metal material such as molybdenum (FIG. 3I).

Should the filling of the cavity project beyond the mouth of the cavity and cover the insulating layer 235, a CMP step (<<chemical mechanical polishing>>) can be performed so that the material 244 of the gate 240 in the cavity 236 does not exceed the mouth of the cavity.

As mentioned above, at least one drain region and at least one source region are intended to be formed in the first part 210 and second part 230 respectively of the stack 205.

According to one possible embodiment of these drain and source regions, it is possible, after forming the gate 240, to remove the insulating layer 235 above parts 210 and 230 of the stack 205, in order to conduct ion implanting e.g. in As or P or B or BF2, followed by the siliciding of parts 210 and 230.

According to one variant of the method, before the formation step of the gate 240 in the cavity 235, it is possible to form spacers which will allow the gate to be electrically separated firstly from that part 210 of the stack 205 intended to form a transistor source region and secondly from that part 230 of the stack 205 intended to form a drain region.

The invention claimed is:

1. A microelectronic device comprising:
    a support;
    at least one first block and at least one second block resting on the support, in which respectively at least one drain region and at least one source region are formed; and
    plural cylindrical wires, connecting a first region of the first block with another region of the second block, and said plural cylindrical wires form a transistor channel or a transistor channel with plural branches or plural transistor channels, at least two wires being aligned in a direction forming a nonzero angle with a main plane of the support,
    wherein the wires are directly attached to a portion of the first region of the first block and to another portion of the other region of the second block, at least one wire among the wires being in a material different from the respective portion of the first region and/or of the other respective portion of the other region of the second block to which the at least one wire is attached.

2. A microelectronic device according to claim 1, wherein at least one wire amongst the wires is not in contact with the support.

3. A microelectronic device according to claim 1, wherein at least two wires are aligned in a direction parallel to the main plane of the support.

4. A microelectronic device according to claim 1, wherein the first block and the second block include at least one layer in a first semiconductor material, and at least one layer in a second semiconductor material, different from the first semiconductor material.

5. A microelectronic device according to claim 1, wherein the first block and the second block include alternating layers in a first semiconductor material and layers in a second semiconductor material different from the first semiconductor material.

6. A microelectronic device according to claim 5, wherein the wires in a third semiconductor material are different from the first semiconductor material and from the second semiconductor material.

7. A microelectronic device according to claim 1, wherein the wires are separate or disjoined.

8. A microelectronic device according to claim 1, further comprising:
    a mechanical structure, connected to the support, that supports the plural cylindrical wires.

* * * * *